(12) United States Patent
Hsu et al.

(10) Patent No.: US 7,319,608 B2
(45) Date of Patent: Jan. 15, 2008

(54) NON-VOLATILE CONTENT ADDRESSABLE MEMORY USING PHASE-CHANGE-MATERIAL MEMORY ELEMENTS

(75) Inventors: Louis L. C. Hsu, Fishkill, NY (US); Brian L. Ji, Fishkill, NY (US); Chung Hon Lam, Peekskill, NY (US); Hon-Sum Philip Wong, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/172,473

(22) Filed: Jun. 30, 2005

(65) Prior Publication Data
US 2007/0002608 A1    Jan. 4, 2007

(51) Int. Cl.
*G11C 11/00* (2006.01)
(52) U.S. Cl. .................. 365/163; 365/104; 365/149
(58) Field of Classification Search ................ 365/149, 365/232, 104, 145, 177, 185.23, 163
See application file for complete search history.

(56) References Cited

U.S. PATENT DOCUMENTS

| 5,111,427 | A | 5/1992 | Kobayashi et al. |
| 5,296,716 | A | 3/1994 | Ovshinsky et al. |
| 6,191,973 | B1 | 2/2001 | Moyer |
| 6,269,016 | B1 | 7/2001 | Moyer |
| 6,317,349 | B1 * | 11/2001 | Wong ........................... 365/49 |
| 6,738,278 | B2 * | 5/2004 | Kim et al. ..................... 365/49 |
| 6,885,602 | B2 | 4/2005 | Cho et al. |
| 2005/0169095 | A1 * | 8/2005 | Bedeschi et al. ........... 365/232 |
| 2006/0018183 | A1 * | 1/2006 | De Sandre et al. ......... 365/232 |
| 2006/0067097 | A1 * | 3/2006 | Lien et al. ..................... 365/49 |

OTHER PUBLICATIONS

G. Wicker et al., "Nonvolatile, High Density, High Performance Phase Change Memory," Ovonyx, Inc., Mission Research Corporation, pp. 1-8, Sep. 1999.

* cited by examiner

*Primary Examiner*—Richard T. Elms
*Assistant Examiner*—Dang Nguyen
(74) *Attorney, Agent, or Firm*—Ido Tuchman; Ryan, Mason & Lewis, LLP

(57) ABSTRACT

A non-volatile content addressable memory cell comprises: a first phase change material element, the first phase change material element having one end connected to a match-line; a first transistor, the first transistor having a gate connected to a word-line, a source connected to a true bit-read-write-search-line, and a drain connected to another end of the first phase change material element; a second phase change material element, the second phase change material element having one end connected to the match-line; and a second transistor, the second transistor having a gate connected to the word-line, a source connected to a complementary bit-read-write-search-line, and a drain connected to another end of the second phase change material element.

21 Claims, 5 Drawing Sheets

US 7,319,608 B2

NON-VOLATILE CONTENT ADDRESSABLE MEMORY USING PHASE-CHANGE-MATERIAL MEMORY ELEMENTS

FIELD OF THE INVENTION

The present invention relates generally to memory devices and, more particularly, to integrated circuit content addressable memory devices.

BACKGROUND OF THE INVENTION

Random access memory (RAM) associates data with an address. Volatile RAMs such as dynamic RAM (DRAM) and static RAM (SRAM) are traditionally used in today's computers. However, as wireless mobile computing systems become more popular, intensive research and development in the memory area is now focusing on new non-volatile memories. Important non-volatile RAMs known today are ferroelectric RAM (FeRAM) using non-linear capacitance due to different polarization of the lead-zirconium-titanate (PZT) material, magnetic RAM (MRAM) using the magneto-resistance changes with magnetic polarity, and Chalcogenide phase change materials using resistance changes in ordered (conductive) and disordered (resistive) phases.

Advancement in telecommunication technology leads to an increasing number of applications using content addressable memory devices (CAM). The CAM associates an address with data. The data are presented on the inputs of the CAM that searches for a match for those data stored in the CAM. When a match is found the CAM identifies the address location of the data.

Most existing CAM products are volatile technologies based on SRAM or DRAM cells. FIG. 1 shows a typical SRAM based binary CAM cell 10. Two inverters INV1 and INV2 form a latch that stores the true and complementary data on nodes N1 and N2. In the write mode, data are written into CAM cells through bitlines BL and bBL through negative-channel metal oxide semiconductor (NMOS) transistor T1 and T2. In the precharge phase of the search mode, matchline (ML) is precharged to high. In the evaluation phase of the search mode, input data presented to the CAM are delivered to the CAM cells through searchlines SL and bSL.

When there is a match, the two gates in the path of T3 and T4 as well as in the path of T5 and T6 will have different polarity, so that one of the transistors in each path will be off. Thus, there is no current flowing between the match-line and sink-line through a matched CAM cell.

On the other hand, when there is a mismatch, one of the two paths will have both transistors turned on and allow current flowing between the sink-line and match-line. Sink-line is normally connected to ground and thus will discharge the match-line when a mismatch occurs. In an example of a 16 bit wide CAM, each match-line is connected to all sixteen CAM cells 10. When any of the CAM cells shows a mismatch, the match-line will be discharged to zero. If all sixteen cells match, the match-line will stay at the precharged high level and a match is found.

Although SRAM-based CAM dominates today's technology, it is a volatile technology where the data is lost when power is turned off. In computation applications in the future, particularly for mobile applications, non-volatile technology is likely to be pervasive.

There are some known non-volatile CAM approaches. U.S. Pat. No. 5,111,427 describes a non-volatile CAM with electrically erasable programmable read-only memory (EEPROM) cells. The EEPROM based CAMs require much slower programming time compared to the volatile CAMs. More recently, U.S. Pat. Nos. 6,191,973 and 6,269,016 describe a non-volatile CAM based on magnetic RAM cells. Such cells encounter more expansive deposition of magnetic layers, as well as the requirement of sensitive sensing of small resistance changes. For example, the typical magneto resistance changes for the "1" state and "0" state in a MRAM cell is 20%-30%, with the highest reported lab data up to 100%.

Accordingly, a need exists for improved non-volatile CAM systems.

SUMMARY OF THE INVENTION

The above discussed and other drawbacks and deficiencies of the prior art are overcome or alleviated by a CAM cell and system that use phase change materials.

For example, in one aspect of the invention, a non-volatile content addressable memory cell comprises: a first phase change material element, the first phase change material element having one end connected to a match-line; a first transistor, the first transistor having a gate connected to a word-line, a source connected to a true bit-read-write-search-line, and a drain connected to another end of the first phase change material element; a second phase change material element, the second phase change material element having one end connected to the match-line; and a second transistor, the second transistor having a gate connected to the word-line, a source connected to a complementary bit-read-write-search-line, and a drain connected to another end of the second phase change material element.

An example of a phase change material is the Chalcogenide alloy, $Ge_xSb_yTe_z$. As compared to materials used in magneto resistance based memory elements, phase change material shows a change of resistance of at least an order of magnitude.

Advantageously, a phase-change-material (PCM) element is provided for non-volatile (NV) memory. The element may operate in both the content addressable memory (CAM) mode and the random access memory (RAM) mode. Illustrative embodiments provide non-volatile-content-addressable-memory cell, system architecture and operating methods for the NV-CAM array and peripheral circuits. The peripheral circuits support precharge and search operations in the CAM mode. The illustrative architecture also supports word line activation, write and read operation in the RAM mode. Still further, an illustrative PCM element of the invention also has bit-blocking capability and word-masking capability.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Nonvolatile memory using phase change materials (PCM), such as Chalcogenides, is disclosed in U.S. Pat. No. 5,296,716, the disclosure of which is incorporated by reference herein. The term "Chalcogen" refers to the Group VI elements of the periodic table. Chalcogenide refers to materials containing at least one of these elements such as the alloy of germanium, antimony, and tellurium, etc. The Chalcogenide phase change material, e.g., $Ge_2Sb_2Te_5$, can be programmed and reprogrammed into a large range of resistance states.

In PCM-based memory, data programming is achieved through thermally induced structural phase changes when electrical pulses are applied to the Chalcogenide resistors. In the write operation, a high current, short pulse will lead to the amorphous phase (or so called "reset" state) with high resistance. A lower and longer current pulse will lead to the crystalline phase with low resistance (or called low resistance "set" state). Read operation is performed with an even lower current that does not cause any phase change. The ratio of the resistance between two states can be greater than 1,000 times, which provides a high sensing margin.

By way of further example, U.S. Pat. No. 6,885,602, the disclosure of which is incorporated by reference herein, discloses that in a write operation, when a current is applied to the PCM to generate a temperature greater than or equal to its melting temperature and then the PCM is rapidly cooled down, the PCM becomes amorphous and data '1' may be recorded in the PCM. In this case, the PCM is said to have entered a "reset" state. If the PCM is heated at a temperature greater than or equal to a crystallization temperature, maintained for a given time, and cooled down, the PCM becomes crystalline and data '0' may be recorded in the PCM. In this case, the PCM is said to have entered a "set" state. When an external current is applied to the PCM, a resistance of the PCM changes. When the resistance of the PCM changes, a voltage changes, thus allowing the expression of binary values '1' and '0'. In a read operation, a bit-line and a word-line may be selected to choose a particular memory cell.

Figure 1:
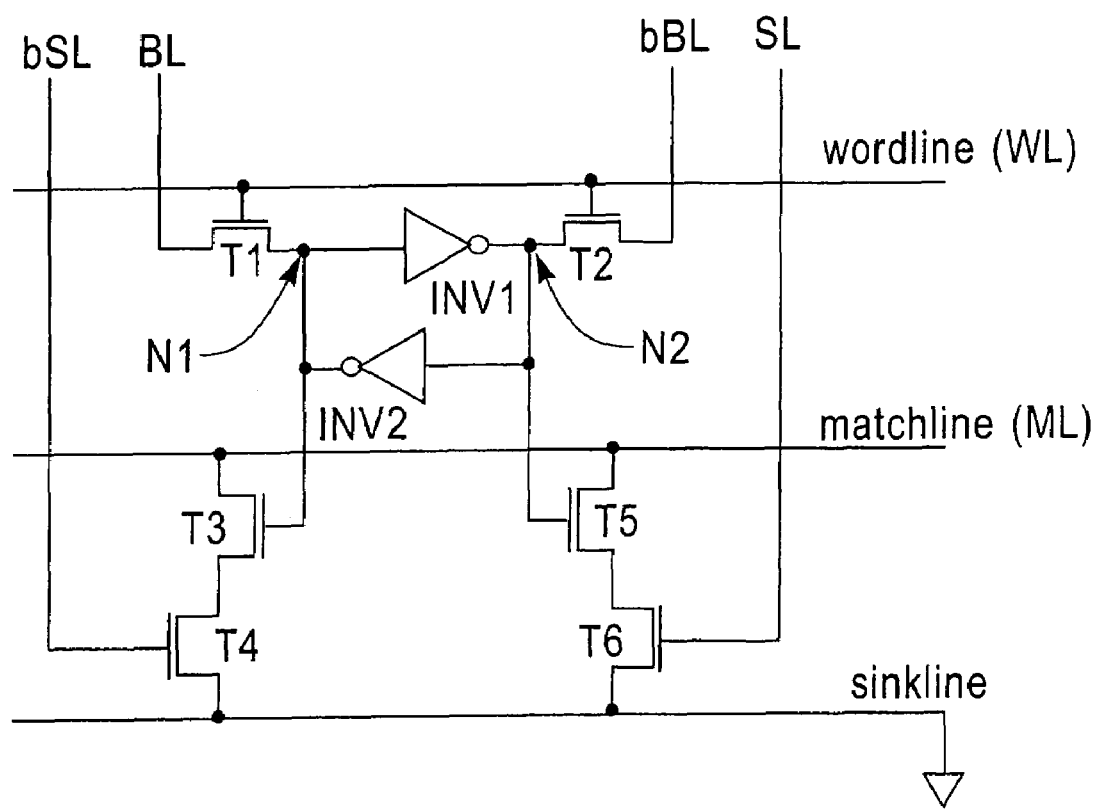
FIG. 1 is a diagram illustrating an SRAM-based CAM.
Figure 2:
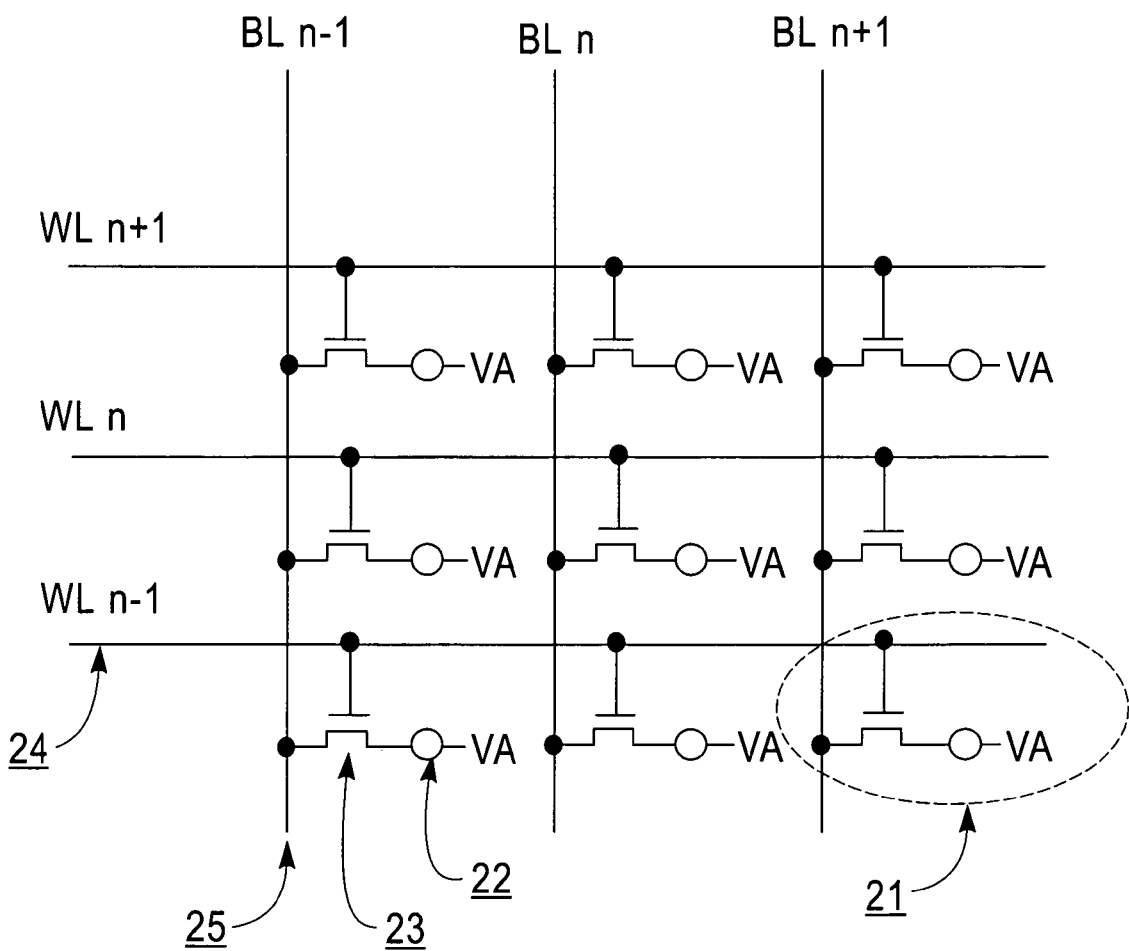
FIG. 2 is a diagram illustrating a PCM RAM array.

FIG. 2 shows a typical implementation of a phase change material (PCM) random access memory (RAM) array 20, which is an array of PCM RAM cells 21. The array comprises a plurality of wordlines and a plurality of bitlines, and a two dimensional matrix of cells. A PCM-RAM cell 21 comprises: (1) a phase change material 22, represented by a small circle, with one end connected to a voltage source VA; (2) a n-type field effect transistor (nFET) 23 that has its gate connected to the word-line (WL) 24 and its source and drain connected to the bitline (BL) 25 and the phase change material 22, respectively. Only one wordline in the array is activated in the write and read operation. In the write operation, electric current pulses are driven along the bit-lines to program 1s and 0s, based on the pulse strength and length. In the read operation, a current pulse lower than a threshold level (for phase change) is sent along the bitline, and a sense amplifier is used.

In accordance with principles of the invention, a content addressable memory (CAM) using phase change material (PCM) is provided. The phase-change-material content addressable memory (PCM-CAM) is a system comprising an array of PCM-CAM cells, and peripheral circuits for the content addressable memory (CAM) operation, and for the random access memory (RAM) operation.

Figure 3:
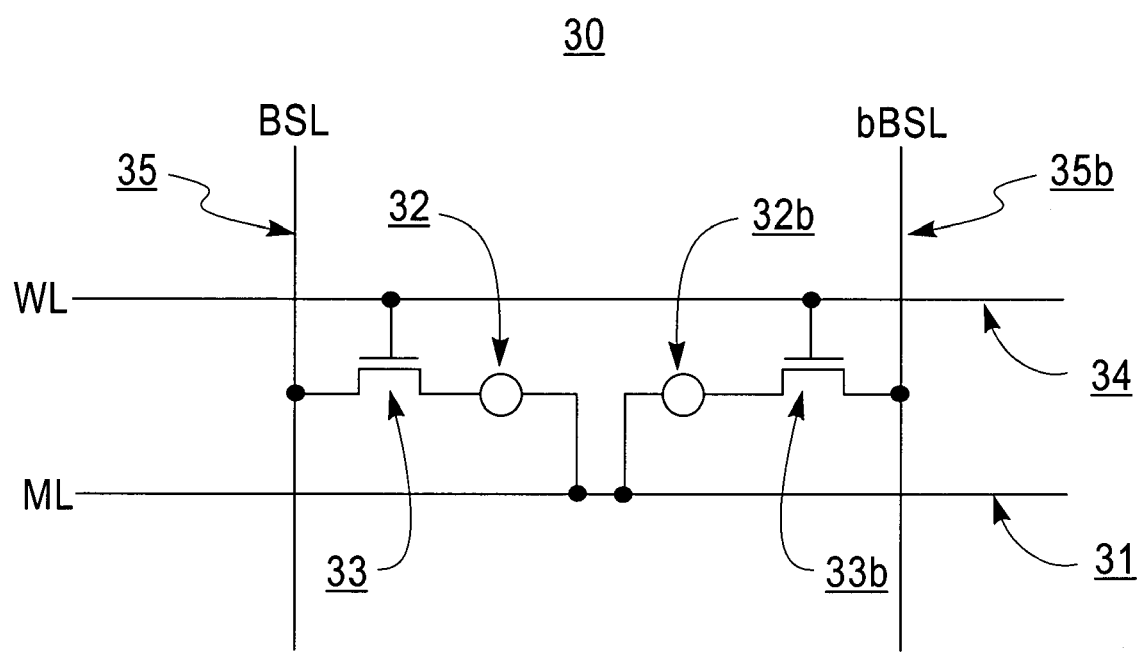
FIG. 3 is a diagram illustrating a PCM-CAM cell, according to an embodiment of the invention.

FIG. 3 shows an illustrative embodiment of a phase-change-material-content-addressable-memory (PCM-CAM) cell 30. PCM-CAM cell 30 comprises: (1) a first phase change material element 32 represented by a small circle, with one end connected to the Match-Line (ML) 31; (2) a first transistor (e.g., n-channel field effect transistor) 33 that has its gate connected to the word-line (WL) 34 and its source and drain connected to the true Bit-read-write-Search-Line (BSL) 35 and the first phase change material element 32, respectively; (3) a second phase change material element 32b represented by a small circle, with one end connected to the Match-Line (ML) 31; (4) a second transistor (e.g., n-channel field effect transistor) 33b that has its gate connected to the word-line (WL) 34 and its source and drain connected to the complementary Bit-read-write-Search-Line (bBSL) 35b and the second phase change material element 32b, respectively.

Table 1 describes write and read operations in the RAM mode, while Table 2 describes precharge and search operations in the CAM mode.

RAM Mode

TABLE 1

Write and read operations in the RAM mode

| | WL | ML | BSL | Data (32) | bBSL | bData (32b) |
|---|---|---|---|---|---|---|
| Write 1 | high | VA | $I_{reset}$ | 1 (high R) | $I_{set}$ | 0 (low R) |
| Write 0 | high | VA | $I_{set}$ | 0 (low R) | $I_{reset}$ | 1 (high R) |
| Read | high | VA | $I_{read}$ | 1/0 | $I_{read}$ | 0/1 |

Here "1" is denoted by the reset state (high resistance) and "0" is denoted by the set state (low resistance). The corresponding pulse currents are $I_{reset} > I_{set} > I_{read}$.

CAM Mode

TABLE 2

Precharge and search operations in the CAM mode

| | WL | BSL | Data (32) | bBSL | bData (32b) | ML |
|---|---|---|---|---|---|---|
| Precharge | high | high | 1/0 | high | 0/1 | high |
| Search for "0" & match | high | floating, weak high | 0 (low R) | low | 1 (high R) | high |
| Search for "0" & mismatch | high | floating, weak high | 1 (high R) | low | 0 (low R) | low |

TABLE 2-continued

Precharge and search operations in the CAM mode

| | WL | BSL | Data (32) | bBSL | bData (32b) | ML |
|---|---|---|---|---|---|---|
| Search for "1" & match | high | low | 0 (low R) | floating, weak high | 1 (high R) | high |
| Search for "1" mismatch | high | low | 1 (high R) | floating, weak high | 0 (low R) | low |

In the search for "0" operation, bBSL is driven low while BSL is set to be floating or weakly high (so that it does not charge up the ML during a mismatch). If the Data is "0", match-line (ML) will stay high since it has a high resistance path to bBSL. If the Data is "1", ML will be discharged to low since it has a low resistance path to bBSL. Similarly, in the search for "1" operation, BSL is driven low while bBSL is set to be floating or weakly high.

The current through the phase change material should be limited to be less than the threshold value, in order to avoid overwriting the stored data during CAM operation.

In an array of CAM, each word-line and corresponding match-line are connected to a number of cells. If any one cell is a mismatch, the match-line line will be driven low. If all cells are matching, then the match-line will stay high.

Figure 4:
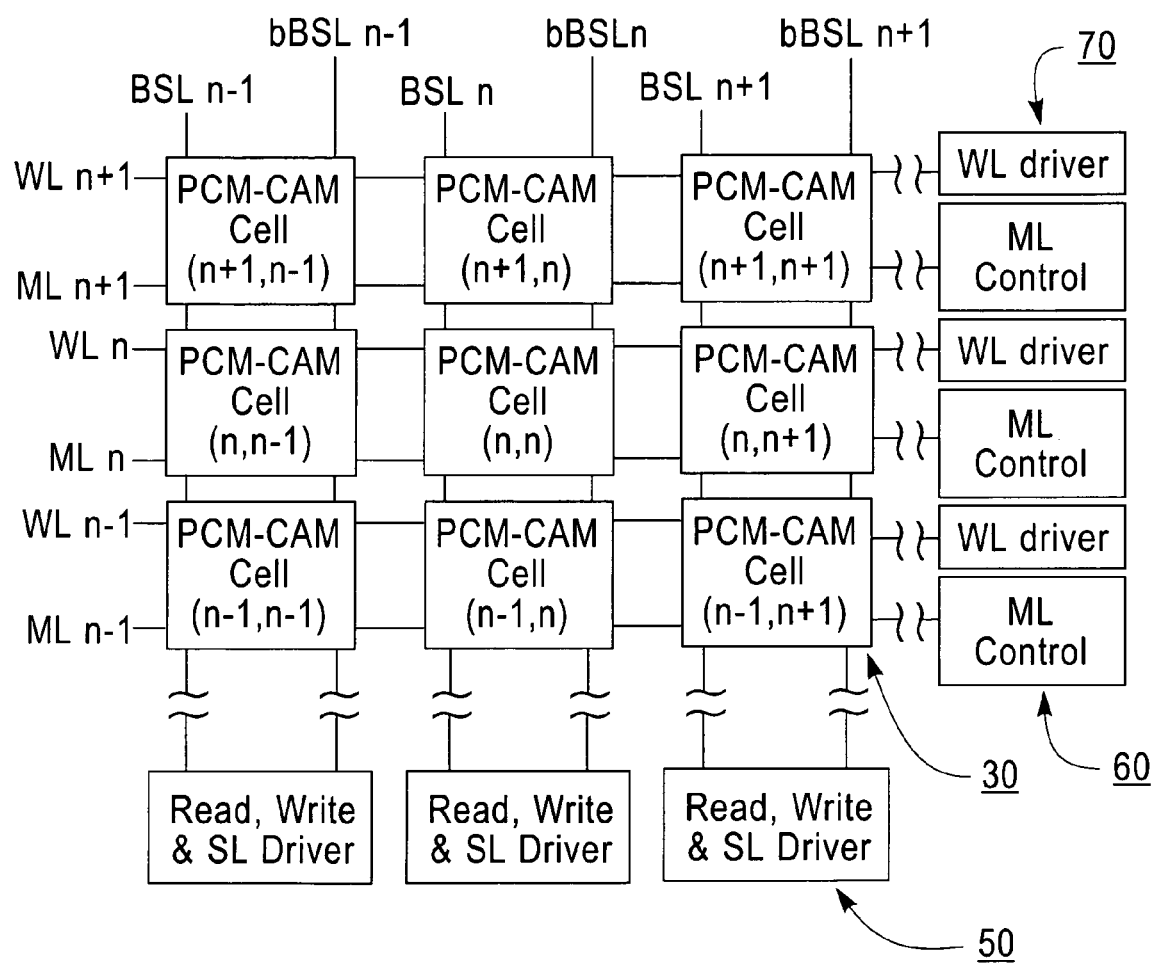
FIG. 4 is a diagram illustrating a PCM-CAM array and peripheral blocks, according to an embodiment of the invention.

Shown in FIG. 4, a PCM-CAM array 40 comprises a plurality of Word-Lines (WL) and Match-Lines (ML), a plurality of true Bit-read-write-Search-Lines (BL-SL) and complementary Bit-read-write-Search-Lines (bBSL), and a two dimensional matrix of PCM-CAM cells 30 (as shown in FIG. 3). Each pair of true and complementary Bit-read-write-Search-Lines (BSL and bBSL) is connected to a Read, Write & Search Line (SL) Driver block 50. The Read, Write & SL Driver block 50 performs the read and write operations in RAM mode, and also drives the data to be compared with the CAM cells in the CAM mode.

Each Match-Line (ML) is connected to a Match-line (ML) Control block 60. In the RAM mode, the Match-line (ML) Control block 60 provides the Match-Line (ML) with a positive voltage source (as the voltage source VA in the conventional PCM). In the RAM mode, a Word-Line driver block 70 functions as a conventional WL decoder and driver, and activates only one wordline in the RAM mode. In CAM mode, Word-Line driver block 70 drives all Word-Lines to a high voltage level (e.g., 1.5V~3.5V).

Figure 5:
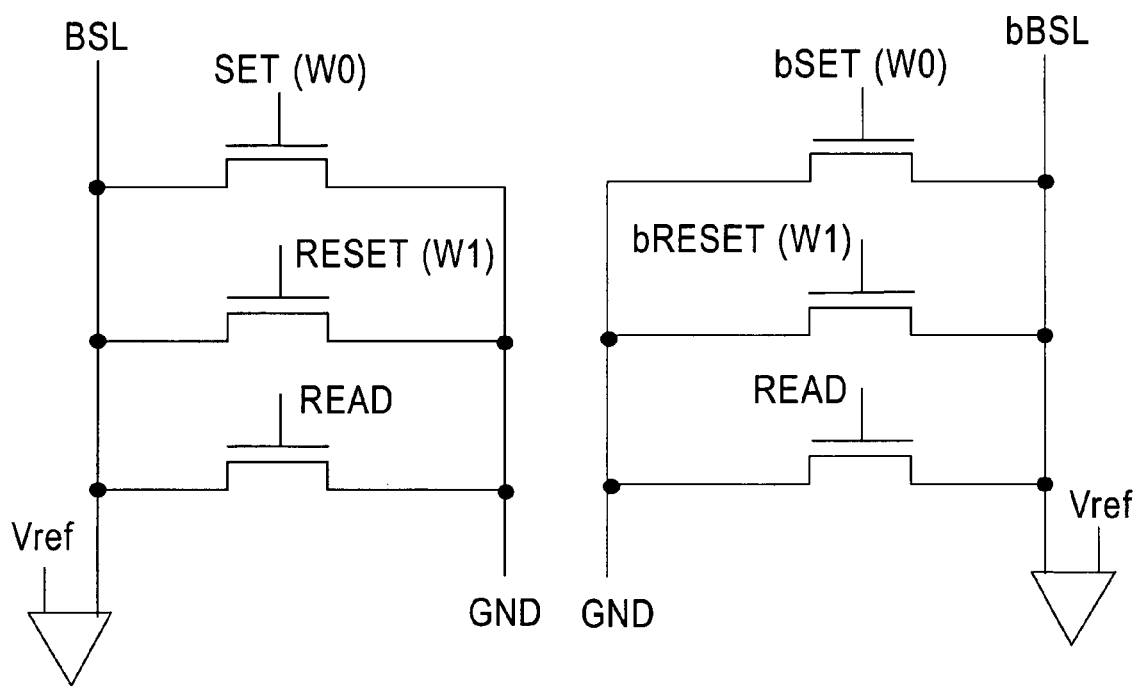
FIG. 5 is a diagram illustrating a read, write and search line driver, according to an embodiment of the invention.

The Read, Write, and Search-Line Driver 50 is shown in FIG. 5. The signals SET, RESET and READ are used to switch the corresponding transistors to perform write 0, write 1 and read operation. Appropriate transistor sizing will set the pulse current in the range required.

Figure 6:
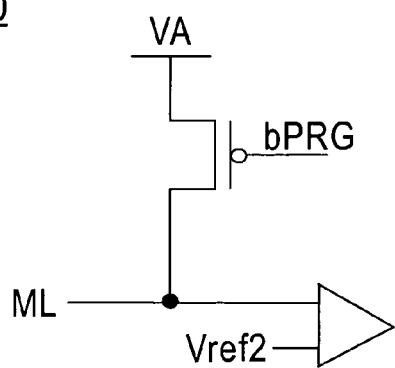
FIG. 6 is a match-line control block, according to an embodiment of the invention.

The Match-Line control block 60 is shown in FIG. 6. In the RAM mode, this block precharges the Match-Line to the voltage level VA (e.g., 1.0V~2.0V). In the CAM mode, block 60 precharges the Match-Line to a high level (e.g., 1.0V~2.0V) in the precharge phase and performs the sense operation in the evaluation phase.

By de-activating one or a group of word-lines (e.g., by not driving them), the corresponding word-lines will be masked and not participate in the CAM search operation. By setting both BSL and bBSL to be floating or weak high (e.g., 0.5V~2.0V), instead of having one of them low), the corresponding search line is blocked.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A non-volatile content addressable memory cell, comprising:
   a first phase change material element, the first phase change material element having one end connected directly to a match-line;
   a first transistor, the first transistor having a gate connected to a word-line, a source connected to a true bit-read-write-search-line, and a drain connected to another end of the first phase change material element;
   a second phase change material element, the second phase change material element having one end connected directly to the match-line; and
   a second transistor, the second transistor having a gate connected to the word-line, a source connected to a complementary bit-read-write-search-line, and a drain connected to another end of the second phase change material element.

2. The memory cell of claim 1, wherein the first phase change material element and second phase change material element each comprise a chalcogenide.

3. The memory cell of claim 1 wherein the first phase change material element and second phase change material element each comprise an alloy containing at least one of germanium, antimony and tellurium.

4. The memory cell of claim 1 wherein the first phase change material element and second phase change material element each comprise $Ge_2Sb_2Te_5$.

5. The memory cell of claim 1, wherein the first transistor and the second transistor each comprise an n-channel field effect transistor.

6. A non-volatile content addressable memory system, comprising:
   a plurality of word-lines;
   a plurality of match-lines;
   a plurality of true bit-read-write-search-lines;
   a plurality of complementary bit-read-write-search-lines; and
   an array of non-volatile content addressable memory cells, wherein at least one of the memory cells comprises:
   a first phase change material element, the first phase change material element having one end connected directly to one of the plurality of match-lines;
   a first transistor, the first transistor having a gate connected to one of the plurality of word-lines, a source connected to one of the plurality of true bit-read-write-search-lines, and a drain connected to another end of the first phase change material element;

a second phase change material element, the second phase change material element having one end connected directly to the match-line; and a second transistor, the second transistor having a gate connected to the word-line, a source connected to one of the plurality of complementary bit-read-write-search-lines, and a drain connected to another end of the second phase change material element.

7. The memory system of claim 6, wherein the array of nonvolatile content addressable memory cells comprises a two dimensional matrix of nonvolatile content addressable memory cells.

8. The memory system of claim 6, further comprising a plurality of match-line control blocks, wherein the plurality of match-line control blocks are respectively connected to the plurality of the match-lines.

9. The memory system of claim 8, wherein, in a first mode, at least one match-line control block precharges a match-line to a first voltage level, and in a second mode, precharges the match-line to a second voltage level in a precharge phase and performs a sense operation in an evaluation phase.

10. The memory system of claim 6, further comprising a plurality of word-line driver blocks, wherein the plurality of word-line driver blocks are respectively connected to the plurality of the word-lines.

11. The memory system of claim 10, wherein, in a first mode, at least one word-line driver block functions as a word-line decoder and driver, and in a second mode, drives the plurality of word-lines to a given voltage level.

12. The memory system of claim 6, further comprising a plurality of read, write, and search-line drivers, wherein the plurality of drivers are respectively connected to pairings of the plurality of true bit-read-write-search-lines and the plurality of complementary bit-read-write-search-lines.

13. The memory system of claim 12, wherein at least one read, write, and search-line driver generates a set signal, a reset signal, and a read signal that are used to switch corresponding transistors to perform a write zero operation, a write one operation, and a read operation, respectively.

14. The memory system of claim 6, wherein by de-activating one or more of the word-lines, the corresponding word-lines are masked and do not participate in a content addressable memory search operation.

15. The memory system of claim 6, wherein by setting a pairing of a true bit-read-write-search-line and a complementary bit-read-write-search-line to be one of floating or a weak high level, the corresponding search line is blocked.

16. A non-volatile memory cell, comprising:
a first phase change material element, the first phase change material element having one end connected to a match-line;

a first transistor, the first transistor having a gate connected to a word-line, a source connected to a true bit-read-write-search-line, and a drain connected to another end of the first phase change material element;

a second phase change material element, the second phase change material element having one end connected to the match-line; and a second transistor, the second transistor having a gate connected to the word-line, a source connected to a complementary bit-read-write-search-line, and a drain connected to another end of the second phase change material element;

wherein the first transistor, the first phase change material element, the second transistor and the second phase change material element are selectively operative to function in a random access memory (RAM) mode or a content addressable memory (CAM) mode.

17. The memory cell of claim 16, wherein in a logic one write operation in the RAM mode, the match-line is held at a fixed voltage level, a reset current is applied to the true bit-read-write-search-line and a set current is applied to the complementary bit-read-write-search-line such that the first phase change material element is in a reset state thereby storing a logic one value and the second phase change material element is in a set state thereby storing a logic zero value.

18. The memory cell of claim 16, wherein in a logic zero write operation in the RAM mode, the match-line is held at a fixed voltage level, a set current is applied to the true bit-read-write-search-line and a reset current is applied to the complementary bit-read-write-search-line such that the first phase change material element is in a set state thereby storing a logic zero value and the second phase change material element is in a reset state thereby storing a logic one value.

19. The memory cell of claim 16, wherein in a logic zero search operation in the CAM mode, the complementary bit-read-write-search-line is driven to a logic low value and the true bit-read-write-search-line is set to float.

20. The memory cell of claim 19, when the first phase change material element is in a reset state, the match-line is discharged to a logic low value due to a low resistance path to the complementary bit-read-write-search-line.

21. The memory cell of claim 16, wherein in a logic one search operation in the CAM mode, the true bit-read-write-search-line is driven to a logic low value and the complementary bit-read-write-search-line is set to float.

* * * * *